United States Patent
Sekiguchi (10) Patent No.: US 8,445,358 B2
(45) Date of Patent: May 21, 2013

(54) METHOD FOR MANUFACTURING SEMICONDUCTOR SUBSTRATE AND METHOD FOR MANUFACTURING SEMICONDUCTOR DEVICE

(75) Inventor: Keiichi Sekiguchi, Isehara (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 176 days.

(21) Appl. No.: 13/070,513

(22) Filed: Mar. 24, 2011

(65) Prior Publication Data
US 2011/0244653 A1    Oct. 6, 2011

(30) Foreign Application Priority Data
Mar. 31, 2010   (JP) .................. 2010-083832

(51) Int. Cl.
*H01L 21/762* (2006.01)
(52) U.S. Cl.
USPC ........... 438/458; 438/459; 438/455; 438/489; 257/336; 257/350; 257/351; 257/357; 257/E21.568
(58) Field of Classification Search
USPC ............. 438/458, 455, 459, 489; 257/336, 257/350, 351, 357, E21.568
See application file for complete search history.

(56) References Cited

U.S. PATENT DOCUMENTS

| | | | |
|---|---|---|---|
| 5,358,879 A | 10/1994 | Brady et al. | |
| 5,547,883 A | 8/1996 | Kim | |
| 6,225,192 B1 * | 5/2001 | Aspar et al. | 438/460 |
| 6,372,609 B1 * | 4/2002 | Aga et al. | 438/459 |
| 6,773,971 B1 | 8/2004 | Zhang et al. | |
| 7,365,361 B2 | 4/2008 | Sekiguchi et al. | |

FOREIGN PATENT DOCUMENTS

| | | |
|---|---|---|
| EP | 1 045 448 | 10/2000 |
| JP | 2000-124092 | 4/2000 |
| JP | 2000-294515 | 10/2000 |

\* cited by examiner

*Primary Examiner* — Thinh T Nguyen
(74) *Attorney, Agent, or Firm* — Eric J. Robinson; Robinson Intellectual Property Law Office, P.C.

(57) ABSTRACT

An object of the present invention is to reduce the influence of a foreign substance adhering to a single crystalline semiconductor substrate and manufacture a semiconductor substrate with a high yield. Another object of the present invention is to manufacture, with a high yield, a semiconductor device which has stable characteristics. In the process of manufacturing a semiconductor substrate, when an embrittled region is to be formed in a single crystalline semiconductor substrate, the surface of the single crystalline semiconductor substrate is irradiated with hydrogen ions from oblique directions at multiple (at least two) different angles, thereby allowing the influence of a foreign substance adhering to the single crystalline semiconductor substrate to be reduced and allowing a semiconductor substrate including a uniform single crystalline semiconductor layer to be manufactured with a high yield.

9 Claims, 9 Drawing Sheets

METHOD FOR MANUFACTURING SEMICONDUCTOR SUBSTRATE AND METHOD FOR MANUFACTURING SEMICONDUCTOR DEVICE

BACKGROUND OF THE INVENTION

1. Field of the Invention

The present invention relates to a method for manufacturing a semiconductor substrate provided with a single crystalline semiconductor layer over an insulating surface, and a method for manufacturing a semiconductor device.

2. Description of the Related Art

In addition to single crystalline silicon substrates which are manufactured by thinly slicing an ingot of single crystalline silicon, integrated circuits using a semiconductor substrate which is referred to as a silicon-on-insulator (hereinafter also referred to as "SOI") substrate have been developed, in which a thin single crystalline semiconductor layer is provided on an insulating surface. The integrated circuits using an SOI substrate has been attracting attention as an integrated circuit which reduces parasitic capacitance between a drain of a transistor and the substrate and improves the performance of a semiconductor integrated circuit.

As a method for manufacturing an SOI substrate, a hydrogen ion addition separation method has been known (for example, see Patent Document 1). The hydrogen ion addition separation method refers to a method for manufacturing an SOI substrate, in which hydrogen ions are added to a single crystalline silicon substrate to form a microbubble layer at a predetermined depth from the surface, and a thin single crystalline silicon layer is attached to base substrate with the microbubble layer as a cleavage surface.

[Reference]
[Patent Document]
[Patent Document 1] Japanese Patent Application Laid-Open No. 2000-124092

SUMMARY OF THE INVENTION

In the process of manufacturing a semiconductor substrate such as an SOI substrate, foreign substances such as particles adhering to a single crystalline semiconductor substrate (a single crystalline silicon substrate in the case of an SOI substrate) cause defects such as a defective junction of a semiconductor film with or a defective formation of a semiconductor film onto a semiconductor substrate obtained, leading to a decrease in yield.

Therefore, an object of the present invention is to reduce the influence of a foreign substance adhering to a single crystalline semiconductor substrate and manufacture a semiconductor substrate with a high yield.

There is a possibility that a semiconductor device formed in a semiconductor substrate with defects may cause failures and the like in operation to degrade electrical characteristics of the semiconductor device. Therefore, another object of the present invention is to reduce defects of a semiconductor substrate, which are caused by foreign substances such as particles, and manufacture, with a high yield, a semiconductor device which have stable characteristics.

When a single crystalline semiconductor substrate is irradiated with hydrogen ions to form an embrittled region at a predetermined depth from the surface, a thin single crystalline semiconductor layer can be attached to a base substrate (also referred to as a supporting substrate) with the embrittled region as a cleavage surface. When the single crystalline semiconductor substrate is to be irradiated with hydrogen ions to form an embrittled region, the surface of the single crystalline semiconductor substrate is irradiated with hydrogen ions from oblique directions at multiple (at least two) different angles.

Figure 6A:
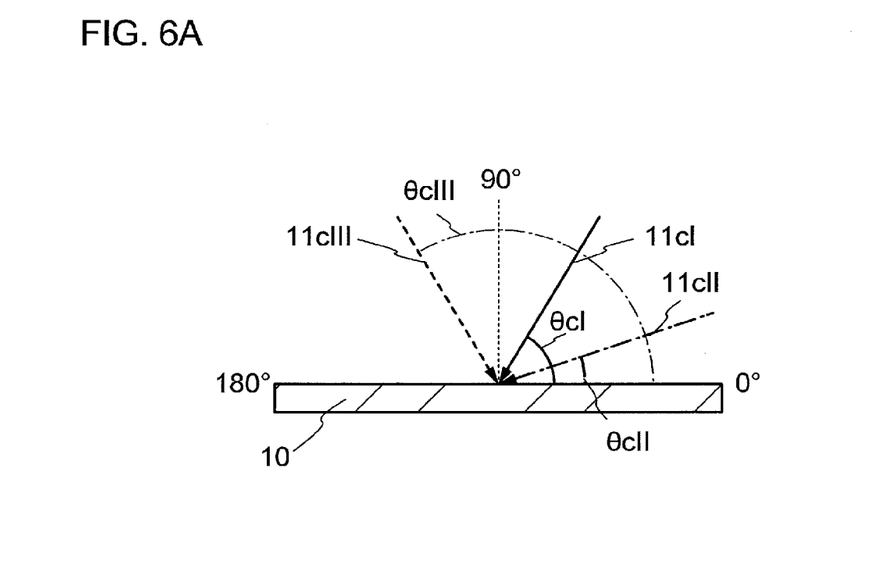
FIGS. 6A and 6B are views showing a frame format for explaining the definition of an irradiation angle of hydrogen ions

The irradiation angles in this specification will be described with reference to FIGS. 6A and 6B. FIG. 6A is a cross-sectional view of a step for manufacturing a semiconductor substrate as an aspect of the present invention, which shows a step of irradiating a single crystalline semiconductor substrate $10$ with hydrogen ions ($11cI$, $11cII$, $11cIII$). On the other hand, FIG. 6B is a plan view of a step for manufacturing a semiconductor substrate as an aspect of the present invention, which shows a step of irradiating the single crystalline semiconductor substrate $10$ with hydrogen ions ($11pI$, $11pII$, $11pIII$, $11pIV$).

Figure 6B:
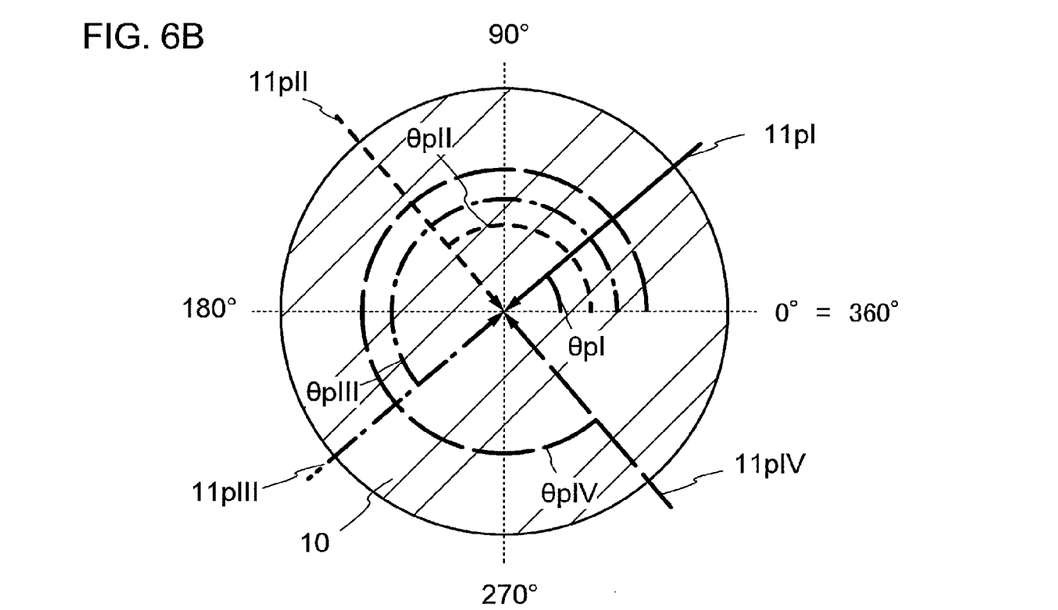

The irradiation angle $\theta$ cover an irradiation angle $\theta c$ defined in the cross-sectional view shown in FIG. 6A and an irradiation angle $\theta p$ defined in the plan view shown in FIG. 6B.

As shown in FIG. 6A, the surface of the single crystalline semiconductor substrate $10$ is irradiated obliquely with hydrogen ions. Thus, the irradiation angle $\theta c$ defined in the cross-sectional view falls within the range greater than $0°$ and less than $90°$ ($0° < \theta c < 90°$) or the range greater than $90°$ and less than $180°$ ($90° < \theta c < 180°$). Therefore, in terms of irradiation angle $\theta c$, the irradiation angle $\theta cI$, the irradiation angle $\theta cII$, and the irradiation angle $\theta cIII$ are different from each other.

As shown in FIG. 6B, the irradiation angle $\theta p$ defined in the plan view is $0°$ to $360°$ in the plane of the single crystalline semiconductor substrate $10$. Therefore, in terms of irradiation angle $\theta p$, the irradiation angle $\theta pI$, the irradiation angle $\theta pII$, the irradiation angle $\theta pIII$, and the irradiation angle $\theta pIV$ are different from each other.

In this specification, the irradiation angles are defined as different irradiation angles when at least either one of the irradiation angle $\theta c$ and the irradiation angle $\theta p$ is different between the irradiation angle $\theta I$ and the irradiation angle $\theta II$. For example, the irradiation angle $\theta I$ and the irradiation angle $\theta II$ are defined as different irradiation angles when there is a difference between the irradiation angles $\theta cI$ and $\theta cII$ or a difference between the irradiation angles $\theta pI$ and $\theta pII$ in terms of irradiation angle $\theta I$ ($\theta cI$, $\theta pI$) and irradiation angle $\theta II$ ($\theta cII$, $\theta pII$). More specifically, in terms of irradiation angle $\theta I$ ($\theta cI$, $\theta pI$) and irradiation angle $\theta II$ ($\theta cII$, $\theta pII$), the irradiation angle $\theta I$ and the irradiation angle $\theta II$ are defined as different irradiation angles except when the irradiation angles $\theta cI$ and $\theta cII$ are equal to each other and the irradiation angles $\theta pI$ and $\theta pII$ are equal to each other. The irradiation steps may be carried out separately at different angles, or may be carried out while changing the angle in the same irradiation step.

In the process of manufacturing a semiconductor substrate, foreign substances may adhere onto the single crystalline semiconductor substrate. In this case, in order to add hydrogen ions below the foreign substances, the foreign substances are irradiated from multiple directions. For example, in the case of carrying out hydrogen ion irradiation steps at two angles, the first irradiation angle is preferably $25°$ or more and $85°$ or less with respect to the single crystalline semiconductor substrate, and the second irradiation angle is preferably $95°$ or more and $155°$ or less with respect to the single crystalline semiconductor substrate.

The term "foreign substances" in this specification refer to, for example, particles wafting in a clean room atmosphere, such as cut pieces caused by rubbing of a member or a substrate in an apparatus. The "foreign substances" which cause defects in the process of manufacturing a semiconductor substrate include small ones on the order of 0.1 µm in diameter.

The hydrogen ion irradiation step is preferably applied to the entire surface of the single crystalline semiconductor substrate through the insulating film.

In addition, there is a possibility that the foreign substances may adhere onto the single crystalline semiconductor substrate during hydrogen ion irradiation, during transportation, or during transfer. Thus, a foreign substance removal step such as a cleaning step or a blowing step is preferably carried out before each hydrogen ion irradiation step.

For the hydrogen ion irradiation step, an ion implantation method or an ion doping method can be used.

One embodiment of the present invention disclosed in this specification is a method for manufacturing a semiconductor device, in which an insulating layer is formed over one surface of a single crystalline semiconductor substrate, a first hydrogen ion irradiation step is carried out through the insulating layer at a first irradiation angle from one surface of the single crystalline semiconductor substrate, a second hydrogen ion irradiation step is carried out at a second irradiation angle different from the first irradiation angle from one surface of the single crystalline semiconductor substrate which has been subjected to the first hydrogen ion irradiation step through the insulating layer, thereby forming an embrittled region at a predetermined depth from one surface of the single crystalline semiconductor substrate, a crack is caused in the embrittled region while the single crystalline semiconductor substrate and a supporting substrate attached to each other with the insulating layer interposed therebetween, and a heat treatment is carried out for separating the single crystalline semiconductor substrate in the embrittled region, thereby forming a single crystalline semiconductor layer from the single crystalline semiconductor substrate onto the supporting substrate, the first irradiation angle and the second irradiation angle have oblique directions with respect to the single crystalline semiconductor substrate, and the first irradiation angle is 25° or more and 85° or less with respect to the single crystalline semiconductor substrate, and the second irradiation angle is 95° or more and 155° or less with respect to the single crystalline semiconductor substrate.

Another embodiment of the present invention disclosed in this specification is a method for manufacturing a semiconductor device, in which an insulating layer is formed over one surface of a single crystalline semiconductor substrate, a first hydrogen ion irradiation step is carried out through the insulating layer at a first irradiation angle from one surface of the single crystalline semiconductor substrate, a foreign substance removal step is applied to one surface of the single crystalline semiconductor substrate which has been subjected to the first hydrogen ion irradiation step through the insulating layer, a second hydrogen ion irradiation step is carried out at a second irradiation angle different from the first irradiation angle from one surface of the single crystalline semiconductor substrate which has been subjected to the foreign substance removal step, thereby forming an embrittled region at a predetermined depth from one surface of the single crystalline semiconductor substrate, a crack is caused in the embrittled region while the single crystalline semiconductor substrate and a supporting substrate attached to each other with the insulating layer interposed therebetween, and a heat treatment is carried out for separating the single crystalline semiconductor substrate in the embrittled region, thereby forming a single crystalline semiconductor layer from the single crystalline semiconductor substrate onto the supporting substrate, the first irradiation angle and the second irradiation angle have oblique directions with respect to the single crystalline semiconductor substrate, and the first irradiation angle is 25° or more and 85° or less with respect to the single crystalline semiconductor substrate, and the second irradiation angle is 95° or more and 155° or less with respect to the single crystalline semiconductor substrate.

When a point with no embrittled region formed is caused in the single crystalline semiconductor substrate by blocking hydrogen ions due to foreign substances, the single crystalline semiconductor layer will fail to be separated at the point with no embrittled region formed, thereby causing defective transfer of the single crystalline semiconductor layer to the base substrate. The reduction of the point with no embrittled region formed can reduce defective transfer of the single crystalline semiconductor layer, and manufacture a semiconductor substrate including a uniform single crystalline semiconductor layer.

Therefore, the use of the semiconductor substrate including the uniform single crystalline semiconductor layer can manufacture, with a high yield, a semiconductor device which has stable characteristics.

In the process of manufacturing a semiconductor substrate, when an embrittled region is to be formed in a single crystalline semiconductor substrate, the single crystalline semiconductor substrate is irradiated with hydrogen ions from oblique directions at multiple (at least two) different angles, thereby allowing the influence of a foreign substance adhering to the single crystalline semiconductor substrate to be reduced and allowing a semiconductor substrate including a uniform single crystalline semiconductor layer to be manufactured with a high yield.

There is a possibility that a semiconductor device formed in a semiconductor substrate with defects may cause failures and the like in operation to degrade electrical characteristics of the semiconductor device. Therefore, defects of a semiconductor substrate can be reduced, which are caused by foreign substances such as particles, and a semiconductor device which have stable characteristics manufacture can be manufactured with a high yield.

DETAILED DESCRIPTION OF THE INVENTION

Embodiments and examples according to an aspect of present invention will be described in detail with reference to the accompanying drawings. It is to be noted that the present invention is not defined to description below, and it is easily understood by those skilled in the art that modes and details can be modified in various ways without departing from the purpose and the scope of the present invention. Therefore, unless such changes and modifications depart from the scope of the present invention, they should be construed as being included therein. It is to be noted that in the embodiments of present invention to be described below, the same reference numerals are used to denote the same components in different drawings.

In addition, each of the embodiments described below can be implemented by being combined with any of the other embodiments given in this specification unless otherwise specified.

[Embodiment 1]

An example of a method for manufacturing a substrate provided with a semiconductor layer will be described with reference to FIGS. 1A to 1E. Specifically, a method for manufacturing a substrate will be described over which a single crystalline semiconductor layer is provided with an insulating layer interposed therebetween (a method for manufacturing a semiconductor substrate).

Figure 1A:
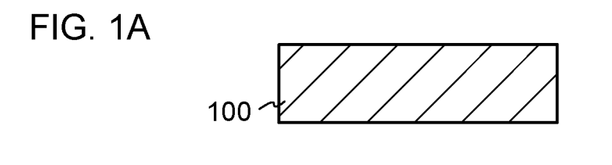
FIGS. 1A to 1E are cross-sectional views illustrating an example of a method for manufacturing a semiconductor substrate.

First, a single crystalline semiconductor substrate 100 is prepared (see FIG. 1A).

As the single crystalline semiconductor substrate 100, a single crystalline semiconductor substrate formed from an element belonging to Group 14 of the periodic table, such as a single crystalline silicon substrate, a single crystalline germanium substrate, or a single crystalline silicon germanium substrate, or a compound semiconductor substrate such as gallium arsenide and indium phosphide can be used. Typical examples of commercially available single crystalline silicon substrates include circular substrates which are 5 inches (125 mm) in diameter, 6 inches (150 mm) in diameter, 8 inches (200 mm) in diameter, 12 inches (300 mm) in diameter, and 16 inches (400 mm) in diameter, and single crystalline silicon substrates can be used which have any of these sizes. It is to be noted that the shape of the single crystalline semiconductor substrate 100 is not limited to a circular shape, and a single crystalline semiconductor substrate can also be processed into a rectangular shape or the like and used. In this embodiment, a case will be described in which a single crystalline silicon substrate is used as the single crystalline semiconductor substrate 100.

Figure 1B:
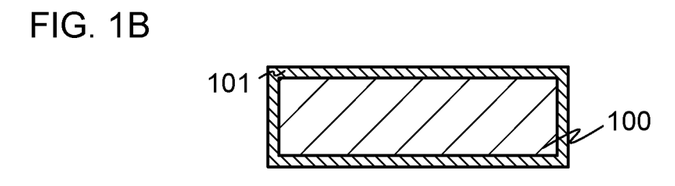
Figure 1C:
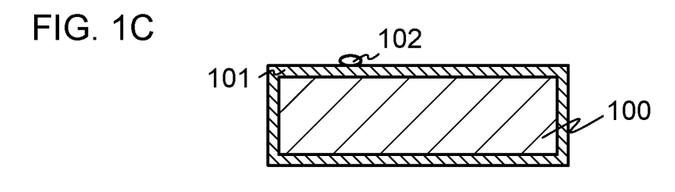
Figure 1D:
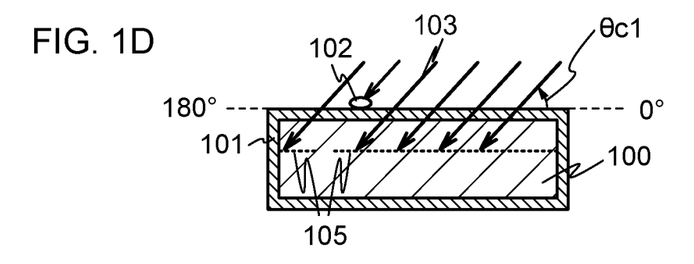
Figure 1E:
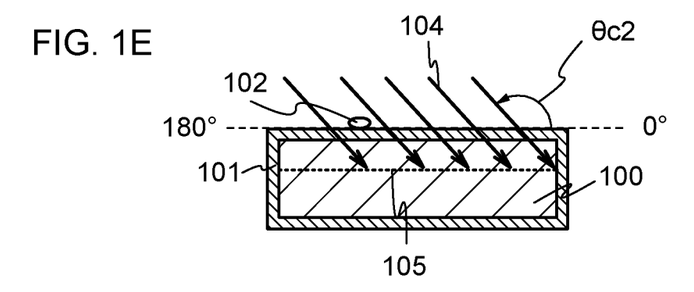

Next, an insulating layer 101 is formed on a surface of the single crystalline semiconductor substrate 100 (see FIG. 1B).

Before the formation of the insulating layer 101, diluted hydrofluoric acid may be preferably used to clean the single crystalline semiconductor substrate. In this case, diluted hydrogen fluoride and ozone water may be discharged alternately to clean the surface of the single crystalline semiconductor substrate 110. If necessary, ultrasonic cleaning or twin-fluid jet cleaning is preferably combined. As the ultrasonic cleaning, megahertz ultrasonic cleaning (megasonic cleaning) is preferable. This cleaning allows foreign substances and organic contamination at the surface of the single crystalline semiconductor substrate to be reduced to form the insulating layer 101 uniformly.

Specific examples of the material forming the insulating layer 101 include a silicon oxide film.

Specific examples of a method for forming the insulating layer 101 include a thermal oxidation method, a CVD method, and a sputtering method.

For example, in the case of forming the insulating layer 101 (in this case, a silicon oxide film) by using a thermal oxidation method, thermal oxidation is preferably carried out in an oxidizing atmosphere containing oxygen ($O_2$) as a main component gas, and containing halogen. For example, the single crystalline semiconductor substrate 100 is subjected to a thermal oxidation treatment in an oxidizing atmosphere containing chlorine (Cl), thereby forming the oxidized insulating layer 101. In this case, the insulating layer 101 serves as an insulating layer containing chlorine. The chlorine contained in the insulating layer 101 forms distortion in the insulating layer 101. As a result, the moisture absorption rate of the insulating layer 101 is improved to increase the diffusion rate of moisture. More specifically, when moisture is present on the surface of the insulating layer 101, the moisture present on the surface can be rapidly absorbed and diffused into the insulating layer 101.

As an example of the thermal oxidation treatment, thermal oxidation can be carried out at a temperature of 900° C. to 1150° C. (typically, 1000° C.) in an oxidizing atmosphere which contains hydrogen chloride (HCl) at a ratio of 0.5 volume % to 10 volume % (typically, 3 volume %) with respect to oxygen. The treatment time may be 0.1 to 6 hours, and preferably 0.5 to 1 hour. The thickness of an oxide film formed by the thermal oxidation treatment may be 10 nm to 1000 nm (preferably, 50 nm to 300 nm), and for example, 100 nm.

The surface of the insulating layer 101 may be cleaned with the use of pure water before hydrogen ion irradiation. In this case, ozone water may be used instead of pure water. Alternatively, ultrasonic cleaning or twin-fluid jet cleaning is preferably combined. As the ultrasonic cleaning, megahertz ultrasonic cleaning is preferable. However, cleaning with diluted hydrofluoric acid makes the surface of the insulating layer 101 hydrophobic, which may be cause defective attachment to the case substrate. Therefore, it is preferable not to use the cleaning with diluted hydrofluoric acid. This cleaning can reduce foreign substances and organic contamination at the surface of the insulating layer 101.

After carrying out the cleaning described above, there is a possibility that foreign substances may adhere onto the single crystalline semiconductor substrate 100 and the insulating layer 101 during transfer or during transportation. In addition, there is a possibility that foreign substances may also adhere onto the single crystalline semiconductor substrate during hydrogen ion irradiation. Since foreign substances causing defectives in the steps for manufacturing a semiconductor substrate include minute particles on the order of 0.1 μm in diameter, it is difficult to zero the number of particles in a clean room atmosphere or in the environment in an apparatus. Therefore, even if foreign substances are removed sufficiently before hydrogen ion irradiation, it is difficult to completely eliminate adhesion in the subsequent steps. The foreign substances on the single crystalline semiconductor substrate serve as masks which interfere with the hydrogen ion irradiation, thereby producing points with no embrittled region formed. Even when the foreign substances on the single crystalline semiconductor substrate are removed by the subsequent treatment, the single crystalline semiconductor layer will fail to be transferred to the points with no embrittled region formed, where defectives of a semiconductor device will be caused. In this embodiment, a case is shown in which a foreign substance 102 is attached onto the insulating layer 101 (see FIG. 1C).

Next, an embrittled region 105 is formed at a predetermined depth from the surface of the single crystalline semiconductor substrate 100 by irradiating the entire surface of the single crystalline semiconductor substrate 100 with hydrogen ions 103 with kinetic energy at an angle θ1 (an angle θc1 in the cross-sectional view of FIG. 1D) through the insulating layer 101.

In this embodiment, the angle is indicated by an irradiation angle θc in the cross-sectional view shown in FIG. 6A. The irradiation angle θc1 refers to an angle to the surface of the insulating layer 101, 0°<θc1<90°, and preferably falls within the range of 25° or more and 85° or less. In this case, a section with no embrittled region formed is caused at the point behind the foreign substance 102 (see FIG. 1D).

Furthermore, the entire surface of the single crystalline semiconductor substrate 100 is irradiated with hydrogen ions 104 with kinetic energy at an angle $\theta_2$ (an angle θc2 in the cross-sectional view of FIG. 1E) through the insulating layer 101. The angle θc2 falls within the range of 90°<θc2<180°. Preferably, the angle θc2 falls within the range of 95° or more and 155° or less.

The irradiation angle θ1 and the irradiation angle θ2 are different from each other, because at least the angles θc1 and θc2 are different from each other. This irradiation also can form an embrittled region 105 at the point where no embrittled region has been formed by the first hydrogen ion irradiation at the predetermined depth from the surface of the single crystalline semiconductor substrate 100. As described above, the embrittled region can be also formed at the point behind the foreign substance 102 (see FIG. 1E).

Figure 2:
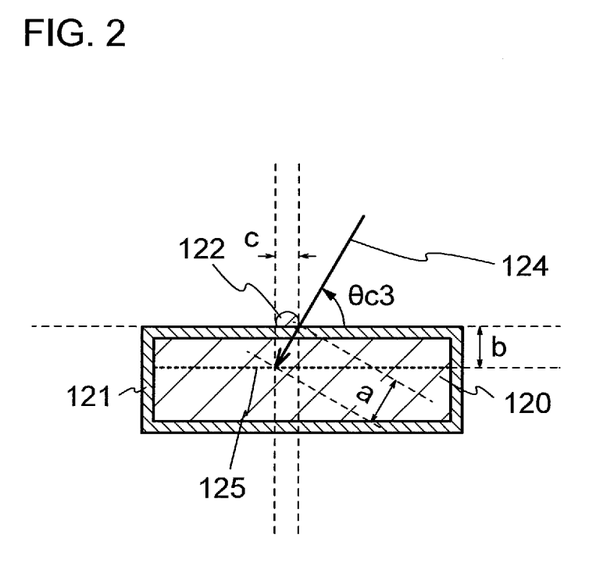
FIG. 2 is a cross-sectional view for explaining an irradiation angle of hydrogen ions.

With reference to FIG. 2, the relationship in a cross-sectional view between an irradiation angle θc and the location of an embrittled region formed will be described in the case of irradiating the single crystalline semiconductor substrate obliquely with hydrogen ions.

First, a base substrate 120 with an insulating layer 121 formed is prepared.

A case will be considered herein in which the base substrate 120 is irradiated with hydrogen ions 124 at angle θc3. In this case, the angle θc3 falls within the range of 0°<θc3<90° or 90°<θc3<180° (see FIG. 2).

The depth b at which an embrittled region 125 is formed can be represented by a sin θc3 using a penetration depth a.

The embrittled region 125 can be formed in a location with a wrapping around distance c. The wrapping around distance c can be represented by a cos θc3 using the penetration depth a.

When hydrogen ion irradiation is carried out obliquely at the irradiation angle θc3, the embrittled region 125 can be formed in the location wrapped around by the wrapping around distance c. More specifically, if any foreign substance 122 is present which has a shadow with a diameter of the wrapping around distance c or less, an embrittled region can be formed below the foreign substance.

The step of hydrogen ion irradiation can be carried out by an ion doping method using an ion doping apparatus or by an ion implantation method using an ion implantation apparatus.

In this embodiment, a case will be given in which the single crystalline semiconductor substrate 100 is irradiated with ions which are not subjected to mass separation, with the use of an ion doping apparatus. A typical example of the ion doping apparatus is a non-mass separation type apparatus for irradiating an object to be processed placed in a chamber with all of ionic species generated by plasma excitation of a process gas. In this specification, a method in which an object is irradiated, with the use of an ion doping apparatus, with ions generated from a source gas (material gas), which are not subjected to mass separation, is referred to as an "ion doping method".

Main components of an ion doping apparatus are as follows: a chamber in which an object to be processed is placed; an ion source for generating desired ions; and an acceleration mechanism for acceleration of ions and irradiation with the ions. The ion source includes a gas supply device for supplying a source gas to generate desired ion species, an electrode for exciting the source gas to generate plasma, etc. As the electrode for forming plasma, a filament-type electrode, an electrode for capacitively-coupled high-frequency discharge, or the like is used. The acceleration mechanism includes electrodes such as an extraction electrode, an acceleration electrode, a deceleration electrode, and a ground electrode; a power source for supplying power to these electrodes; etc. The electrodes constituting the acceleration mechanism are provided with a plurality of openings or slits, and ions generated in the ion source are accelerated through the openings or slits provided in the electrodes. It is to be noted that the configuration of the ion doping apparatus is not limited to the configuration described above, and mechanism are provided as needed.

It is to be noted that examples of the apparatus for ion irradiation include ion implantation apparatuses in addition to ion doping apparatuses. An ion implantation apparatus refers to an apparatus for subjecting ion species in plasma to mass separation and irradiating an object to be processed with an ionic species having a specific mass (a mass-separation type apparatus), which is significantly different from an ion doping apparatus in this respect.

Figure 3A:
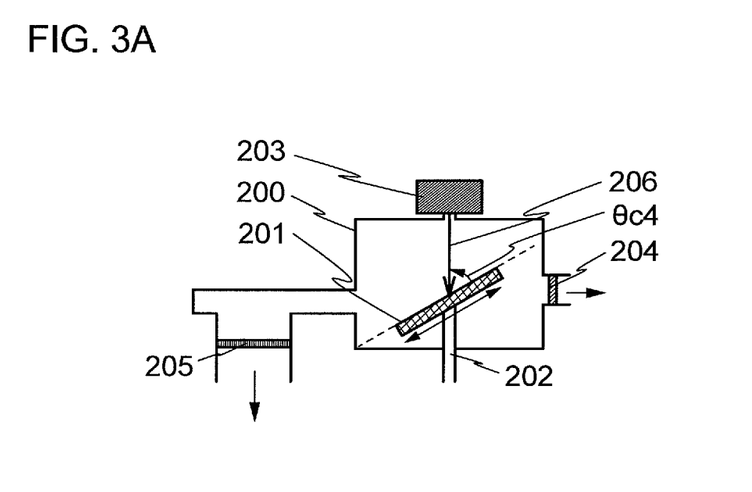
FIGS. 3A and 3B are views showing a frame format of a hydrogen ion irradiation apparatus.

A configuration example of an ion doping apparatus is shown (see FIG. 3A). The ion doping apparatus includes a chamber wall 200, a substrate 201, a stage axis 202, and an ion source 203. In this case, a valve 204 and a valve 205 respectively lead to a substrate transfer chamber and a vacuum pump. For an ion 206 emitted from the ion source 203, only a straight component is extracted, formed into a linear shape, and made incident to the substrate 201. The substrate 201 can be slid from side to side, and can be scanned so as to be irradiated with the ion 206 uniformly in the plane. The adoption of this method can also irradiate a large-area substrate with hydrogen ions with high uniformity.

Figure 3B:
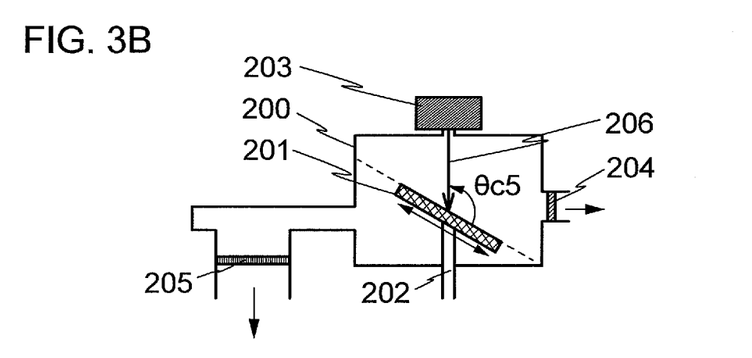

In addition, the angle of the substrate 201 to the incidence angular direction of the ion 206 can be controlled by forming an angle θc4 or an angle θc5 to the incidence angle direction of the ion 206 (see FIGS. 3A and 3B).

In this case, the angles θc4 and θc5 respectively fall within the range of 0°<θc4<90° or 90°<θc4<180° and the range of 0°<θc5<90° or 90°<θc5<180°.

Therefore, the embrittled region can be formed more uniformly in accordance with the step of ion irradiation from an oblique direction at the different irradiation angle θc4 or θc5.

Next, a method for transferring a single crystalline semiconductor layer of a single crystalline semiconductor substrate to a base substrate will be described with reference to FIGS. 4A to 4C.

Figure 4A:
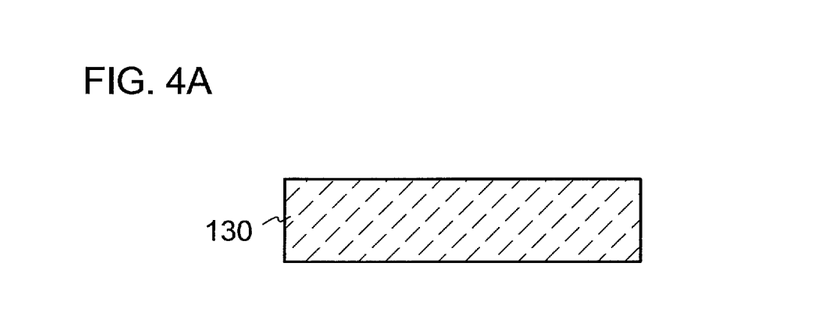
FIGS. 4A to 4C are cross-sectional views illustrating an example of a method for manufacturing a semiconductor substrate.

First, a base substrate (or a supporting substrate) 130 is prepared (see FIG. 4A). It is preferable to clean a surface of the base substrate 130 in advance before using the base substrate 130. Specifically, the surface of the base substrate 130 is subjected to ultrasonic cleaning with the use of a hydrochloric acid/hydrogen peroxide mixture (HPM), a sulfuric acid/hydrogen peroxide mixture (SPM), an ammonium hydroxide/hydrogen peroxide mixture (APM), diluted hydrogen fluoride (DHF), or the like. Through such a cleaning treatment, the surface of the base substrate 130 can be planarized, and abrasive particles left on the surface of the base substrate 130 can be removed.

As the base substrate 130, an insulating substrate is preferably used. Specific examples of the insulating substrate include a variety of glass substrates that are used in the electronics industry, such as aluminosilicate glass substrates, aluminoborosilicate glass substrates, and barium borosilicate glass substrates; quartz substrates; ceramic substrates; sapphire substrates; and plastic substrates. In addition, while a single crystalline semiconductor substrate (for example, a single crystalline silicon substrate) or a polycrystalline semiconductor substrate (for example, a polycrystalline silicon substrate) can also be used as the base substrate 130, an insulating substrate which can have a larger size and is inexpensive is preferably used in consideration of mass productivity and cost. In this embodiment, a case will be described in which a glass substrate which is one of insulating substrates is used as the base substrate 130.

Figure 4B:
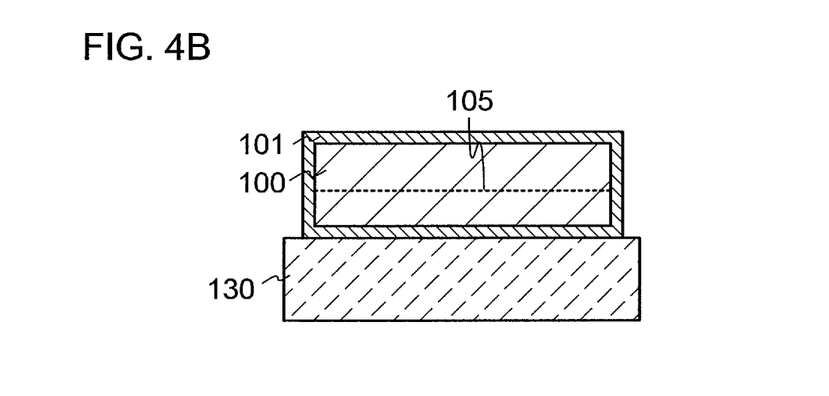

Next, the single crystalline semiconductor substrate 100 and the base substrate 130 are attached to each other with an insulating layer 101 interposed therebetween (see FIG. 4B).

Figure 4C:
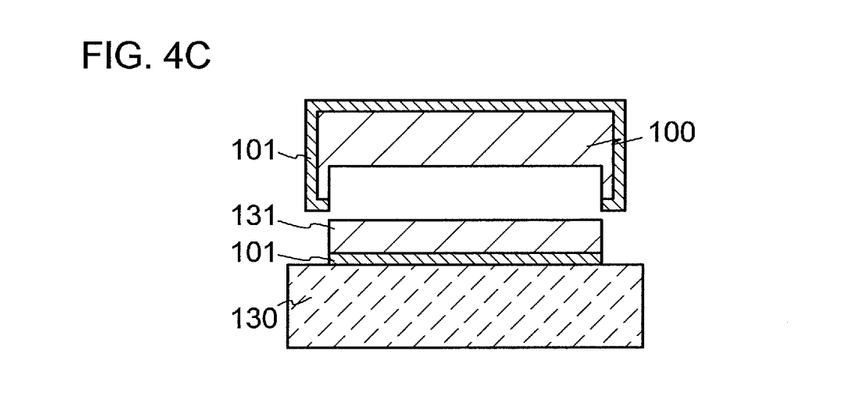

Next, a heat treatment is carried out to separate the single crystalline semiconductor substrate 100 at an embrittled region 105, and thereby a single crystalline semiconductor layer 131 is provided over the base substrate 130 with the insulating layer 101 interposed therebetween (see FIG. 4C). The heat treatment forms minute voids in the embrittled region 105, separates an element added by the ion irradiation out into the minute voids, and increases the internal pressure of the minute voids. The increase in pressure causes a change in the volume of the minute voids in the embrittled region 105, and causes a crack in the embrittled region 105. Thus, the single crystalline semiconductor substrate 100 is separated along the embrittled region 105. As a result, the single crystalline semiconductor layer 131 separated from the single crystalline semiconductor substrate 100 is formed over the base substrate 130 with the insulating layer 101 interposed therebetween. The thickness of the single crystalline semiconductor layer 131 which is formed after the separation may be, for example, greater than or equal to 10 nm and less than or equal to 500 nm, preferably greater than or equal to 50 nm and less than or equal to 200 nm. It is to be noted that as a heating unit for carrying out the heat treatment, a heating furnace such as a resistance heating furnace, a rapid thermal annealing (RTA) apparatus, a microwave heating apparatus, and the like can be used. For example, in the case of using an RTA apparatus, the heat treatment may be carried out at a heating temperature of higher than or equal to 550° C. and lower than or equal to 730° C. for a treatment time of greater than or equal to 0.5 minutes and less than or equal to 60 minutes.

The range of the hydrogen ion concentration in the embrittled region in the single crystalline semiconductor substrate is determined by the conditions for hydrogen ion irradiation, such as the type of the single crystalline semiconductor substrate, the thickness of the insulating layer, and the apparatus for carrying out ion irradiation. As in this embodiment, in the case of carrying out hydrogen ion irradiation more than once, the conditions for hydrogen ion irradiation may be adjusted so that the total hydrogen ion concentration at a desired depth of the single crystalline semiconductor substrate falls within a range which forms an embrittled region in the single crystalline semiconductor substrate.

The embrittled region 105 is formed uniformly in accordance with the method described above, and the single crystalline semiconductor layer can be thus prevented from partially failing to be transferred in the separation step. Therefore, a semiconductor substrate with a single crystalline semiconductor layer in a favorable shape can be manufactured with a high yield.

[Embodiment 2]

A case will be given in which a step of foreign substance removal is carried out when the single crystalline semiconductor substrate is subjected to the second hydrogen ion irradiation in Embodiment 1. Accordingly, description of the same sections as or sections serving similarly to those in Embodiment 1 will be omitted.

Before the step of second hydrogen ion irradiation is carried out for the single crystalline semiconductor substrate, the step of foreign substance removal is added. The step of foreign substance removal involves cleaning with pure water or blowing. Specifically, the step of removing a foreign substance on the insulating layer 101 is added between FIG. 1D and FIG. 1E. The removal of the foreign substance on the insulating layer 101 in advance can reduce the point with no embrittled region formed due to interference with ion irradiation.

For example, as the method for cleaning the insulating layer 101, it is preferable to combine ultrasonic cleaning, pure water cleaning, ozone water cleaning, and twin-fluid jet cleaning appropriately. As ultrasonic cleaning, megasonic cleaning is preferable.

Therefore, in this embodiment, a single crystalline semiconductor substrate can be manufactured with a high yield while reducing the point with no embrittled region formed.

This embodiment can be combined appropriately with the other embodiments in this specification.

[Embodiment 3]

A case will be given in which the step of irradiating the single crystalline semiconductor substrate with hydrogen ions is different from in Embodiment 1. Accordingly, description of the same sections as or sections serving similarly to those in Embodiment 1 will be omitted.

When the single crystalline semiconductor substrate is irradiated with hydrogen ions, the hydrogen ion irradiation is carried out while rotating the substrate. Thus, the hydrogen ion irradiation can be carried out from multiple different angles in the step of single hydrogen ion irradiation, and thus allows hydrogen ions to be added below foreign substances.

An ion doping apparatus including a mechanism for rotating a substrate will be described with reference to FIG. 5.

Figure 5:
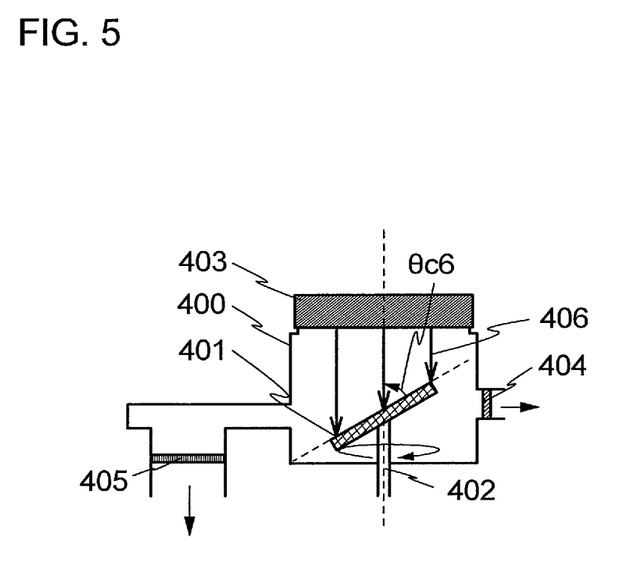
FIG. 5 is a view showing a frame format of a hydrogen ion irradiation apparatus.

A configuration example of an ion doping apparatus is shown (see FIG. 5). The ion doping apparatus includes a chamber wall 400, a substrate 401, a stage axis 402, and an ion source 403. In this case, a valve 404 and a valve 405 respectively lead to a substrate transfer chamber and a vacuum pump. For an ion 406 emitted from the ion source 403, only a straight component is extracted, and made incident to the entire surface of the substrate 401.

The substrate 401 can be tilted at an angle $\theta c6$ to the incident direction of the ion 406. In this case, the angle $\theta c6$ falls within the range of $0°<\theta c6<90°$ or $90°<\theta c6<180°$.

The substrate 401 can be rotated around the axis of the stage axis 402.

The rotation speed of the substrate 401 is determined in the range, for example, from 1 rpm to 60 rpm. The rotational speed is preferably set from 6 rpm to 30 rpm.

The hydrogen ion irradiation carried out while rotating the substrate can reduce the point of the single crystalline semiconductor substrate with no embrittled region formed, as in the case of carrying out hydrogen ion irradiation from multiple different angles. Therefore, defective transfer of a single crystalline semiconductor layer can be reduced, and a single crystalline semiconductor substrate can be manufactured with a high yield.

This embodiment can be combined appropriately with the other embodiments in this specification.

[Embodiment 4]

In this embodiment, a method for manufacturing a CMOS (Complementary Metal Oxide Semiconductor) structure will be described with reference to FIGS. 7A to 7E and FIGS. 8A to 8D as an example of a method for manufacturing a semiconductor device mounting a semiconductor integrated circuit including a thin and high-performance semiconductor element for the purpose of high-yield manufacture. It is to be noted that repetitive description of the same sections as or sections serving similarly to those in the other embodiments will be omitted.

Figure 7A:
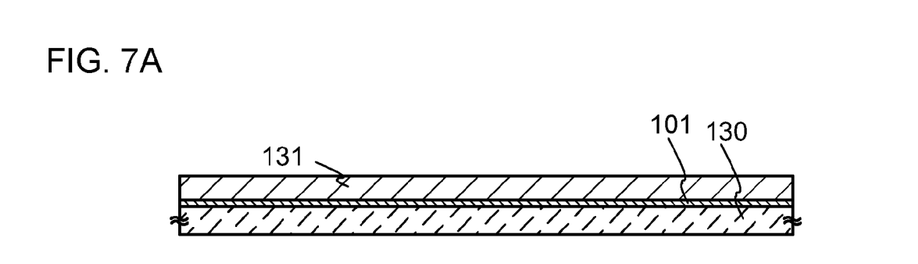
FIGS. 7A to 7E are cross-sectional views illustrating an example of a method for manufacturing a semiconductor substrate.

In FIG. 7A, an insulating layer 101 and a single crystalline semiconductor layer 131 are formed over a base substrate 130. FIG. 7A corresponds to FIG. 4C. It is to be noted that while a case will be given of applying a semiconductor substrate of the structure shown in FIG. 4C in Embodiment 1, semiconductor substrates of the other structures described in this specification can also be applied.

A p-type impurity element such as boron, aluminum, or gallium or an n-type impurity element such as phosphorus or arsenic may be added to the single crystalline semiconductor layer 131 to correspond to regions for forming an n-channel field effect transistor and a p-channel field effect transistor, in order to control the threshold voltage, depending on the conductivity type of the separated single crystalline semiconductor substrate (an impurity element imparting one conductivity type, which is contained in the substrate). The dose of impurity element may be set on the order of $1\times10^{12}$ ions/cm$^2$ to $1\times10^{14}$ ions/cm$^2$.

Figure 7B:
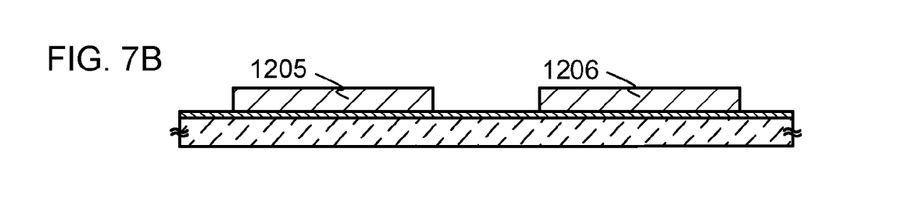

The single crystalline semiconductor layer 131 is etched into island shapes to form separated single crystalline semiconductor layers 1205 and 1206 corresponding to the locations of semiconductor elements (see FIG. 7B).

An oxide film produced on the single crystalline semiconductor layer is removed, and a gate insulating layer 1207 is formed which covers the single crystalline semiconductor layers 1205 and 1206.

The gate insulating layer 1207 may be formed from a silicon oxide or a stacked structure of a silicon oxide and a silicon nitride. The gate insulating layer 1207 may be formed by depositing an insulating film in accordance with a plasma CVD method or a low pressure CVD method, or may be formed by solid-phase oxidation or solid-phase nitridation in accordance with a plasma treatment. This is because the gate insulating layer formed by oxidation or nitridation of the single crystalline semiconductor layer in accordance with a plasma treatment is dense and has a high dielectric strength voltage with excellent reliability. For example, dinitrogen monoxide (N$_2$O) is diluted with Ar by 1 to 3 times (flow rate), and a microwave (2.45 GHz) of 3 kW to 5 kW is applied at a pressure of 10 Pa to 30 Pa to oxidize or nitride the surfaces of the single crystalline semiconductor layers 1205 and 1206. This treatment forms an insulating film with a thickness of 1 nm to 10 nm (preferably 2 nm to 6 nm). Furthermore, while introducing nitrous oxide (N$_2$O) and silane (SiH$_4$), a silicon oxynitride film is formed by a vapor deposition method through the application of microwave power of 3 kW to 5 kW at a pressure of 10 Pa to 30 Pa to form the gate insulating layer. The combination of the solid-phase reaction with the reaction in accordance with the vapor deposition method can form a gate insulating layer which has a low interface state density and an excellent dielectric strength voltage.

In addition, as the gate insulating layer 1207, a high dielectric constant material may be used, such as zirconium dioxide, hafnium oxide, titanium dioxide, and tantalum pentoxide. The use of a high dielectric constant material for the gate insulating layer 1207 can reduce the gate leakage current.

Figure 7C:
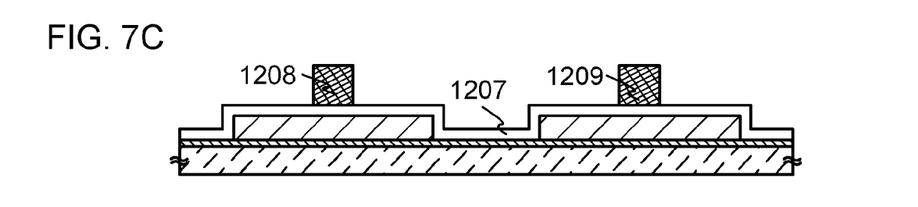
Figure 7D:
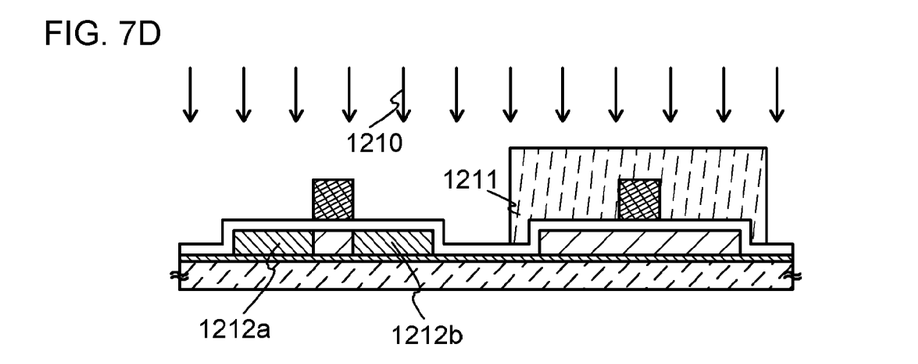
Figure 7E:
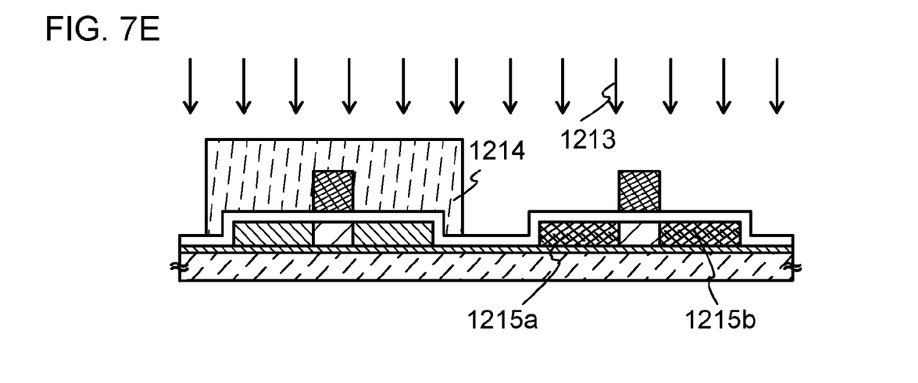

A gate electrode layer 1208 and a gate electrode layer 1209 are formed over the gate insulating layer 1207 (see FIG. 7C). The gate electrode layer 1208 and the gate electrode layer 1209 can be formed by an approach such as a sputtering method, an evaporation method, or a CVD method. The gate electrode layer 1208 and the gate electrode layer 1209 may be formed from an element selected from tantalum (Ta), tungsten (W), titanium (Ti), molybdenum (Mo), aluminum (Al), copper (Cu), chromium (Cr), and neodymium (Nd); or an alloy material or a compound material containing the element as its main component. Alternatively, a semiconductor film typified by a polycrystalline silicon film doped with an impurity element such as phosphorus, or an Ag—Pd—Cu alloy may be used as the gate electrode layer 1208 and the gate electrode layer 1209.

A mask 1211 is formed which covers the single crystalline semiconductor layer 1206. With the mask 1211 and the gate electrode layer 1208 as masks, an impurity element 1210 for imparting n-type conductivity is added to form first n-type impurity regions 1212a and 1212b (see FIG. 7D). In this embodiment, phosphine (PH$_3$) is used as the doping gas containing an impurity element. In this case, doping is carried out so that first n-type impurity regions 1212a and 1212b contain an impurity element for imparting n-type conductivity at a concentration on the order of $1\times10^{17}$ atoms/cm$^3$ to $5\times10^{18}$ atoms/cm$^3$. In this embodiment, phosphorus (P) is used as the impurity element for imparting n-type conductivity.

Next, a mask 1214 is formed which covers the single crystalline semiconductor layer 1205. With the mask 1214 and the gate electrode layer 1209 as masks, an impurity element 1213 for imparting p-type conductivity is added to form a first p-type impurity region 1215a and a first p-type impurity region 1215b (see FIG. 7E). In this embodiment, boron (B) is used as an impurity element, and diborane (B$_2$H$_6$) or the like is used as the doping gas containing the impurity element.

Figure 8A:
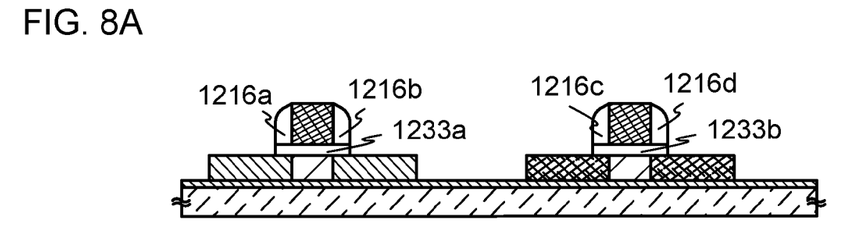
FIGS. 8A to 8D are cross-sectional views illustrating an example of a method for manufacturing a semiconductor substrate.

The mask 1214 is removed, sidewall insulating layers 1216a to 1216d of sidewall structure are formed on side surfaces of the gate electrode layer 1208 and the gate electrode layer 1209, and gate insulating layers 1233a and 1233b are formed (see FIG. 8A). The sidewall insulating layers 1216a to 1216d of sidewall structure may be formed on the side surfaces of the gate electrode layer 1208 and gate electrode layer 1209 in a self-alignment manner, in such a way that an insulating layer covering the gate electrode layer 1208 and the gate electrode layer 1209 is formed and processed by anisotropic etching in accordance with an RIE (Reactive Ion Etching) method. In this case, the insulating layer is not particularly limited. The insulating layer may be, for example, a silicon oxide which is formed by reacting TEOS (Tetraethyl-Ortho-Silicate) or silane or the like with oxygen or nitrous oxide or the like and provides an excellent step coverage. The insulating layers can be formed by a method such as a thermal CVD method, a plasma CVD method, a normal-pressure CVD method, a bias ECR-CVD method, and a sputtering method. The gate insulating layers 1233a and 1233b can be formed by etching the gate insulating layer 1207 with the use of the gate electrode layer 1208 and the gate electrode layer 1209 and the sidewall insulating layers 1216a to 1216d as masks.

In this embodiment, in etching the insulating layer, the insulating layer over the gate electrode layers is removed to expose the gate electrode layers. However, the sidewall insulating layers 1216a to 1216d may be formed to have such a shape that the insulating layer is left on the gate electrode layers. In addition, a protective film may be formed over the gate electrode layers in a subsequent step. The protection of the gate electrode layers in this manner can prevent film reduction of the gate electrode layers when etching is carried out. In addition, in the case of forming silicide in a source region and a drain region, since a metal film formed for the formation of the silicide is not brought into contact with the gate electrode layers, defects such as chemical reaction and diffusion can be prevented even when the material of the metal film is likely to react with the material of the gate electrode layers. The etching method may be a dry etching method or a wet etching method, and various etching methods can be used. In this embodiment, a dry etching method is used. A gas including chlorine as typified by $Cl_2$, $BCl_3$, $SiCl_4$, or $CCl_4$; a gas including fluorine as typified by $CF_4$, $SF_6$, or $NF_3$; or $O_2$ can be appropriately used as the etching gas.

Next, a mask 1218 is formed which covers the single crystalline semiconductor layer 1206. With the mask 1218, the gate electrode layer 1208, and the sidewall insulating layers 1216a and 1216b as mass, an impurity element 1217 for imparting n-type conductivity is added to form second n-type impurity regions 1219a and 1219b and third n-type impurity regions 1220a and 1220b. In this embodiment, $PH_3$ is used as the doping gas containing an impurity element. In this case, the addition is carried out so that the second n-type impurity regions 1219a and 1219b contain the impurity element for imparting n-type conductivity at a concentration on the order of $5\times10^{19}$ atoms/cm$^3$ to $5\times10^{20}$ atoms/cm$^3$. In addition, a channel formation region 1221 is formed in the single crystalline semiconductor layer 1205 (see FIG. 8B).

Figure 8B:
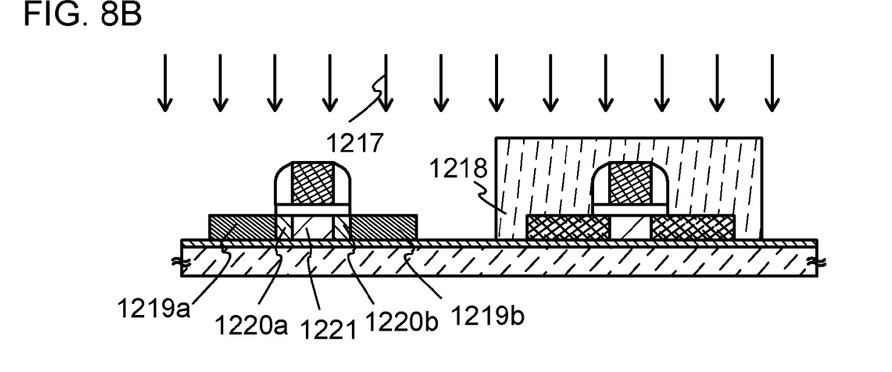

The second n-type impurity region 1219a and the second n-type impurity region 1219b refer to high-concentration n-type impurity regions, which serve as a source and a drain. On the other hand, the third n-type impurity regions 1220a and 1220b are low-concentration impurity regions, which serve as LDD (Lightly Doped Drain) regions. The third n-type impurity regions 1220a and 1220b are formed in regions (also referred to as Loff regions), which are not covered with the gate electrode layer 1208, and thus have the effect of reduction in off current. As a result, it is possible to manufacture a semiconductor device which achieves low power consumption with further increased reliability.

Figure 8C:
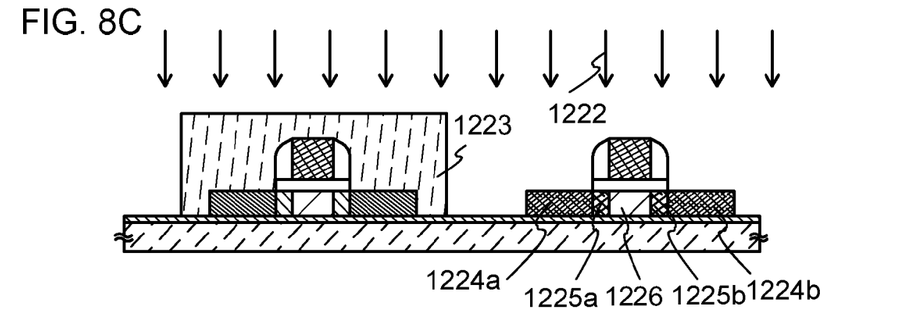

The mask 1218 is removed, and a mask 1223 is formed which covers the single crystalline semiconductor layer 1205. With the mask 1223, the gate electrode layer 1209, and the sidewall insulating layers 1216c and 1216d as masks, and an impurity element 1222 for imparting p-type conductivity is added to form second p-type impurity regions 1224a and 1224b, and third p-type impurity regions 1225a and 1225b.

The addition is carried out so that the second p-type impurity regions 1224a and 1224b contain the impurity element for imparting p-type conductivity at a concentration on the order of $1\times10^{20}$ atoms/cm$^3$ to $5\times10^{21}$ atoms/cm$^3$. In this embodiment, the third p-type impurity regions 1225a and 1225b are formed in a self-alignment manner with the sidewall insulating layers 1216c and 1216d so as to have a lower concentration than the second p-type impurity regions 1224a and 1224b. In addition, a channel formation region 1226 is formed in the single crystalline semiconductor layer 1206 (see FIG. 8C).

The second p-type impurity region 1224a and 1224b refer to high-concentration p-type impurity regions, which serve as a source and a drain. On the other hand, the third p-type impurity regions 1225a and 1225b are low-concentration impurity regions, which serve as LDD regions. The third p-type impurity regions 1225a and 1225b are formed in regions which are not covered with the gate electrode layer 1209, and thus have the effect of reduction in off current. As a result, it is possible to manufacture a semiconductor device which achieves low power consumption with further increased reliability.

The mask 1223 is removed, and a heat treatment, strong light irradiation, or laser light irradiation may be carried out in order to activate the impurity elements. At the same time as the activation, recovery can be achieved from plasma damage to the gate insulating layer and plasma damage to the interface between the gate insulating layer and the single crystalline semiconductor layer.

Figure 8D:
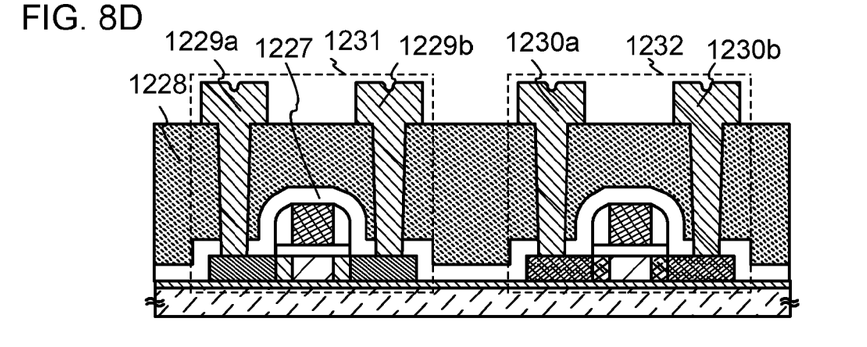

Subsequently, an interlayer insulating layer is formed which covers the gate electrode layers and the gate insulating layers. In this embodiment, a stacked structure is adopted which has an insulating film 1227 containing hydrogen to serve as a protective film and an insulating layer 1228. The insulating film 1227 and the insulating layer 1228 each may be a silicon nitride film, a silicon nitride oxide film, a silicon oxynitride film, or a silicon oxide film formed by using a sputtering method or a plasma CVD method. Alternatively, a single layer structure or a stacked structure of three or more layers may be adopted by using other insulating films containing silicon.

Furthermore, a heat treatment is carried out at 300° C. to 550° C. in a nitrogen atmosphere for 1 to 12 hours to carry out the step of hydrogenating the single crystalline semiconductor layer. Preferably, the thermal treatment is carried out at 400° C. to 500° C. This step is a step for terminating dangling bonds of the single crystalline semiconductor layer with the hydrogen contained in the insulating film 1227 which is an interlayer insulating layer. In this embodiment, the thermal treatment is carried out at 410° C. for 1 hour.

The insulating film 1227 and the insulating layer 1228 can be formed by using a material selected from substances including aluminum nitride (AlN), aluminum oxynitride (AlON), aluminum nitride oxide (AlNO) containing more nitrogen than oxygen, or aluminum oxide, diamond-like carbon (DLC), nitrogen-containing carbon (CN), polysilazane, other inorganic insulating materials. In addition, a siloxane resin may also be used. It is to be noted that the siloxane resin corresponds to a resin that contains a Si—O—Si bond. Siloxane has a skeleton structure composed of a bond of silicon (Si) and oxygen (O). An organic group (for example, an alkyl group or an aryl group) or a fluoro group may be used as a substituent. The organic group may contain a fluoro group. In addition, organic insulating materials may also be used, and polyimide, acrylic, polyamide, polyimide amide, resist, or benzocyclobutene can be used as the organic material. A coating film with high flatness, which is formed by a coating method, may be used as well.

The insulating film 1227 and the insulating layer 1228 can be formed by the following method or tool: dipping, spray coating, a doctor knife, a roll coater, a curtain coater, a knife coater, a CVD method, an evaporation method, or the like. The insulating film 1227 and the insulating layer 1228 may be formed by a droplet discharge method. In the case of using the droplet discharge method, a material solution can be saved. In addition, a method by which a pattern can be transferred or drawn, like a droplet discharge method, for example, a printing method (a method by which a pattern can be formed, such as screen printing or offset printing), etc. can also be used.

Subsequently, contact holes (openings) reaching the single crystalline semiconductor layers are formed in the insulating film 1227 and the insulating layer 1228 with the use of a mask compose of resist. The etching may be carried out once or more than once, depending on the etching selectivity between the materials used. The insulating film 1227 and the insulating layer 1228 are removed by etching to form the openings reaching the second n-type impurity regions 1219a and 1219b and the second p-type impurity regions 1224a and 1224b, which serve as source regions and drain regions. The etching may be wet etching or dry etching, or both wet etching and dry etching may be used. A hydrofluoric acid-based solution such as a mixed solution of ammonium hydrogen fluoride and ammonium fluoride may be used for an etchant for wet etching. A gas including chlorine as typified by $Cl_2$, $BCl_3$, $SiCl_4$, or $CCl_4$; a gas including fluorine as typified by $CF_4$, $SF_6$, or $NF_3$; or $O_2$ can be used appropriately as the etching gas. Furthermore, an inert gas may be added to the etching gas to be used. One or more elements selected from He, Ne, Ar, Kr, and Xe can be used as the inert element to be added.

A conductive film is formed so as to cover the openings, and the conductive film is etched to form wiring layers 1229a, 1229b, 1230a, and 1230b, which are electrically connected to respective source regions and drain regions partly and function as source electrode layers and drain electrode layers. The wiring layers can be formed by forming a conductive film in accordance with a sputtering method, a CVD method, a deposition method, or the like, and then etching the conductive film into desired shapes. Alternatively, a conductive layer can be formed selectively in predetermined locations by a droplet discharge method, a printing method, an electrolytic plating method, or the like. Furthermore, a reflow method or a damascene method may also be used. A metal such as Ag, Au, Cu, Ni, Pt, Pd, Ir, Rh, W, Al, Ta, Mo, Cd, Zn, Fe, Ti, Zr, or Ba is used as the material for the wiring layer to be formed, and further, Si or Ge, or an alloy thereof, or a nitride thereof is used as the material for the wiring layer to be formed. Alternatively, stacked structures of these materials may also be adopted.

Through the steps described above, a semiconductor device can be manufactured which has a CMOS structure including a transistor 1231 to serve as an n-channel thin film transistor and a transistor 1232 to serve as a p-channel thin film transistor, (see FIG. 8D). Although not illustrated, since the CMOS structure is adopted in this embodiment, the transistor 1231 and the transistor 1232 are electrically connected to each other.

The thin film transistors are not limited to this embodiment, and may have a single gate structure with one channel formation region formed, a double gate structure with two channel formation region formed, or a triple gate structure with three channel formation regions formed.

As described above, the semiconductor substrate is used which includes the single crystalline semiconductor layer transferred from the single crystalline semiconductor substrate to the base substrate. Thus, the single crystalline semiconductor layer has high crystallinity.

Accordingly, a thin and high-performance semiconductor device can be manufactured with a high yield.

This embodiment can be combined appropriately with any one of Embodiments 1 to 3.

[Embodiment 5]

The present invention can be implemented in various electronic devices by applying the semiconductor device manufactured in accordance with Embodiment 4.

Examples of such electronic devices include cameras such as video cameras and digital cameras, head-mounted displays (goggle-type displays), car navigation systems, projectors, car stereo sets, personal computers, and portable information terminals (e.g., mobile computers, cellular phones, and e-book readers). Some examples of the electronic devices are shown in FIGS. 9A to 9E.

Furthermore, the present invention can be also applied to semiconductor devices which have a calculation function to allow non-contact data transmission and reception, also referred to as microprocessors, RFID tags, ID tags, IC tags, IC chips, RF tags, wireless tags, electronic tags, or wireless chips.

Figure 9A:
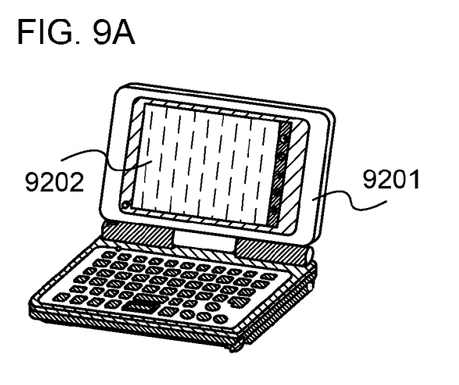
FIGS. 9A to 9E are diagrams illustrating examples of an electronic device using a semiconductor device.

A portable information terminal shown in FIG. 9A includes a main body 9201, a display section 9202, and the like. A high-performance and high-reliability portable information terminal can be provided by applying the semiconductor device according to Embodiment 4.

Figure 9B:
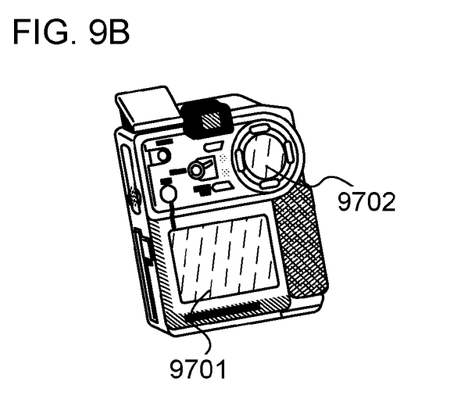

A digital video camera shown in FIG. 9B includes a display section 9701, a display section 9702, and the like. A high-performance and high-reliability video camera can be provided by applying the semiconductor device according to Embodiment 4.

Figure 9C:
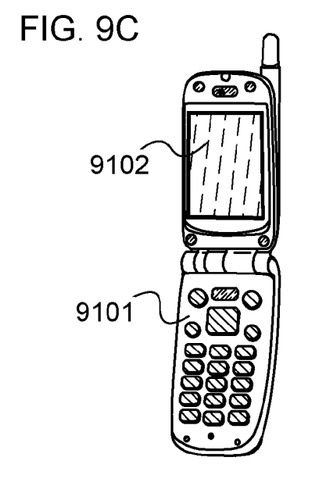

A cellular phone shown in FIG. 9C includes a main body 9101, a display section 9102, and the like. A high-performance and high-reliability cellular phone can be provided by applying the semiconductor device according to Embodiment 4.

Figure 9D:
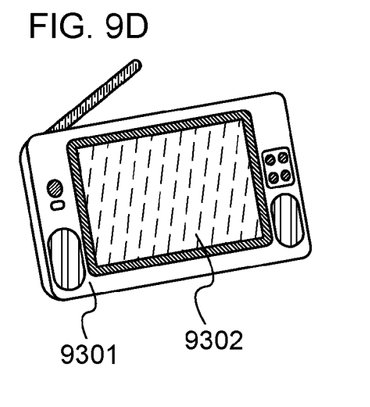

A portable television device shown in FIG. 9D includes a main body 9301, a display section 9302, and the like. A high-performance and high-reliability portable television device can be provided by applying the semiconductor device according to Embodiment 4. Furthermore, the semiconductor device according to the present invention can be applied widely to various types of television devices including a small-sized television incorporated in a portable terminal such as a cellular phone, a medium-sized television which is portable, and a large-sized television (for example, 40 inches or more in size).

Figure 9E:
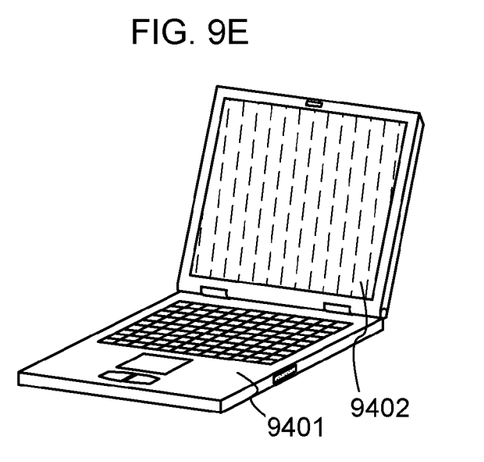

A portable computer shown in FIG. 9E includes a main body 9401, a display section 9402, and the like. A high-performance and high-reliability portable computer can be provided by applying the semiconductor device according to Embodiment 4.

This application is based on Japanese Patent Application serial No. 2010-083832 filed with Japan Patent Office on Mar. 31, 2010, the entire contents of which are hereby incorporated by reference.

What is claimed is:

1. A method for manufacturing a semiconductor substrate, comprising:

forming an insulating layer on a single crystalline semiconductor substrate;

irradiating the single crystalline semiconductor substrate with a hydrogen ion through the insulating layer at a first irradiation angle with respect to one surface of the single crystalline semiconductor substrate;

irradiating the single crystalline semiconductor substrate with the hydrogen ion through the insulating layer at a second irradiation angle from the one surface of the single crystalline semiconductor substrate with respect to an embrittled region at a predetermined depth from the one surface of the single crystalline semiconductor substrate;

attaching a supporting substrate and the single crystalline semiconductor substrate with the insulating layer interposed therebetween; and separating the single crystalline semiconductor substrate at the embrittled region to form a single crystalline semiconductor layer over the supporting substrate, wherein the first irradiation angle is 25° or more and 85° or less with respect to the one surface, and the second irradiation angle is 95° or more and 155° or less with respect to the one surface.

2. The method for manufacturing a semiconductor substrate according to claim 1, wherein an entire surface of the single crystalline semiconductor substrate is irradiated with the hydrogen ion.

3. The method for manufacturing a semiconductor substrate according to claim 1, wherein the irradiating step is conducted while rotating the single crystalline semiconductor substrate.

4. A method for manufacturing a semiconductor device, wherein a semiconductor element is formed by using the single crystalline semiconductor layer formed in accordance with the method for manufacturing a semiconductor substrate according to claim 1.

5. A method for manufacturing a semiconductor substrate, comprising:
 forming an insulating layer on a single crystalline semiconductor substrate;
 irradiating the single crystalline semiconductor substrate with a hydrogen ion through the insulating layer at a first irradiation angle with respect to one surface of the single crystalline semiconductor substrate;
 removing a foreign substance formed on the insulating layer;
 irradiating the single crystalline semiconductor substrate with the hydrogen ion through the insulating layer at a second irradiation angle with respect to the one surface of the single crystalline semiconductor substrate to form an embrittled region at a predetermined depth from the one surface of the single crystalline semiconductor substrate;
 attaching a supporting substrate and the single crystalline semiconductor substrate with the insulating layer interposed therebetween; and
 separating the single crystalline semiconductor substrate at the embrittled region to form a single crystalline semiconductor layer over the supporting substrate,
 wherein the first irradiation angle is 25° or more and 85° or less with respect to the one surface, and the second irradiation angle is 95° or more and 155° or less with respect to the one surface.

6. The method for manufacturing a semiconductor substrate according to claim 5, wherein the foreign substance is removed by a cleaning step.

7. The method for manufacturing a semiconductor substrate according to claim 5, wherein an entire surface of the single crystalline semiconductor substrate is irradiated with the hydrogen ion.

8. The method for manufacturing a semiconductor substrate according to claim 5, wherein the irradiating step is conducted while rotating the single crystalline semiconductor substrate.

9. A method for manufacturing a semiconductor device, wherein a semiconductor element is formed by using the single crystalline semiconductor layer formed in accordance with the method for manufacturing a semiconductor substrate according to claim 5.

* * * * *